US005078812A

United States Patent [19]
McCoy et al.

[11] Patent Number: 5,078,812

[45] Date of Patent: Jan. 7, 1992

[54] METHOD FOR DARKENING A COLOR-SELECTION ELECTRODE

[75] Inventors: Randall E. McCoy, McConnellsburg, Pa.; Jordan R. Nelson, Pennington, N.J.

[73] Assignee: RCA Thomson Licensing Corp., Princeton, N.J.

[21] Appl. No.: 594,476

[22] Filed: Oct. 9, 1990

[51] Int. Cl.$^5$ .......... C23C 16/02

[52] U.S. Cl. .......... 148/270; 148/254; 313/402; 313/408; 427/64; 427/68

[58] Field of Search .......... 148/240, 243, 245, 248, 148/250, 253, 254, 270, 272, 284; 427/64, 68; 313/402, 407, 408, 415

[56] References Cited

U.S. PATENT DOCUMENTS

| | | | |
|---|---|---|---|
| 3,867,207 | 2/1975 | Decker et al. | 117/130 |
| 3,935,036 | 1/1976 | Kinsch | 313/402 |
| 4,121,949 | 10/1978 | Walters | 148/269 |
| 4,444,600 | 4/1984 | Aries et al. | 148/270 |
| 4,612,061 | 9/1986 | Suzuki et al. | 313/402 |
| 4,620,133 | 10/1986 | Morrell et al. | 315/15 |
| 4,717,439 | 1/1988 | Hajdu et al. | 148/253 |
| 4,728,365 | 3/1988 | Jarvi | 148/270 |
| 4,819,489 | 4/1989 | Nelson et al. | 73/854 |
| 4,885,501 | 12/1989 | Tong | 313/402 |
| 4,929,864 | 5/1990 | Tong | 313/402 |

*Primary Examiner*—Jay H. Woo
*Assistant Examiner*—Jeremiah F. Durkin, II
*Attorney, Agent, or Firm*—Joseph S. Tripoli; Dennis H. Irlbeck; Vincent J. Coughlin, Jr.

[57] ABSTRACT

A method for making a dark, adherent coating on exposed metal surfaces of a color-selection electrode assembly of a CRT includes the steps of applying a first solution of aqueous phosphoric acid to the metal surfaces of the assembly; contacting the metal surfaces with a second solution of selenium dioxide and methanol; rinsing the assembly; and then, applying a sealing solution to the surfaces of the assembly.

18 Claims, 1 Drawing Sheet

METHOD FOR DARKENING A COLOR-SELECTION ELECTRODE

This invention relates to a method for darkening a metal part for use within a cathode-ray tube (CRT) and, more particularly, but not exclusively, to a method for making a dark, adherent coating on a color-selection electrode assembly of a CRT.

BACKGROUND OF THE INVENTION

It is a common practice to blacken the surfaces of the color-selection electrode and its support frame, which together comprises the color-selection electrode assembly, in order to increase the radiative characteristics and to reduce the reflectivity thereof. The term color-selection electrode includes not only the conventional shadow mask and tension mask but also similar structures, adjacent to the luminescent screen of the CRT, which intercept at least a portion of an electron beam directed toward the screen to assure excitation of the proper color-emissive phosphor.

One method of blackening the surfaces has been to fire the color-selection electrode, the frame, or the completed assembly in an oxidizing atmosphere to yield a black oxide of iron. However, the quality of such oxide coatings vary considerably. Also, iron oxide has a tendency to flake off the surfaces and to decompose in vacuum when it is heated and bombarded with electrons, as is the case during operation of the color cathode-ray tube. Additionally, such a conventional process is unsatisfactory for darkening color selection electrodes made from materials having a high nickel content. Also, the elevated temperature required during the firing process tends to non-uniformly affect the tension of some of the elements of the tension mask, rendering some of the masks unacceptable for their intended purpose. A need therefore exists for a process that does not require elevated temperatures, is inexpensive to perform, is applicable to both shadow masks and tension masks, and provides uniform results on steel and low expansion nickel-iron alloys.

SUMMARY OF THE INVENTION

In accordance with the present invention, a method for making a dark, adherent coating on exposed metal surfaces of an element of a cathode-ray tube comprises the steps of applying a first solution of aqueous phosphoric acid to the metal surfaces; contacting the metal surfaces with a second solution of selenium dioxide and methanol; rinsing the surfaces; and then, applying a sealing solution to the surfaces.

DETAILED DESCRIPTION OF THE INVENTION

Figure 1:
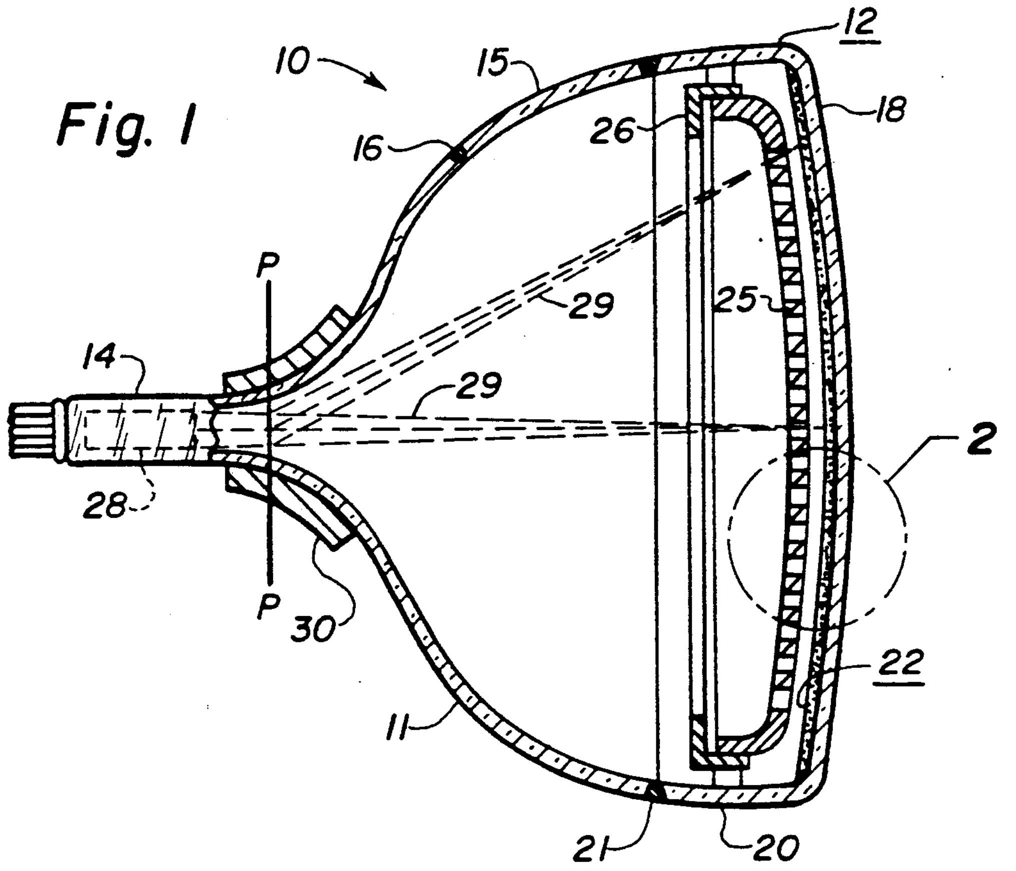
FIG. 1 is a plan view, partially in axial section, of a color cathode-ray tube (CRT) having a color selection electrode assembly made according to the present invention.
Figure 2:
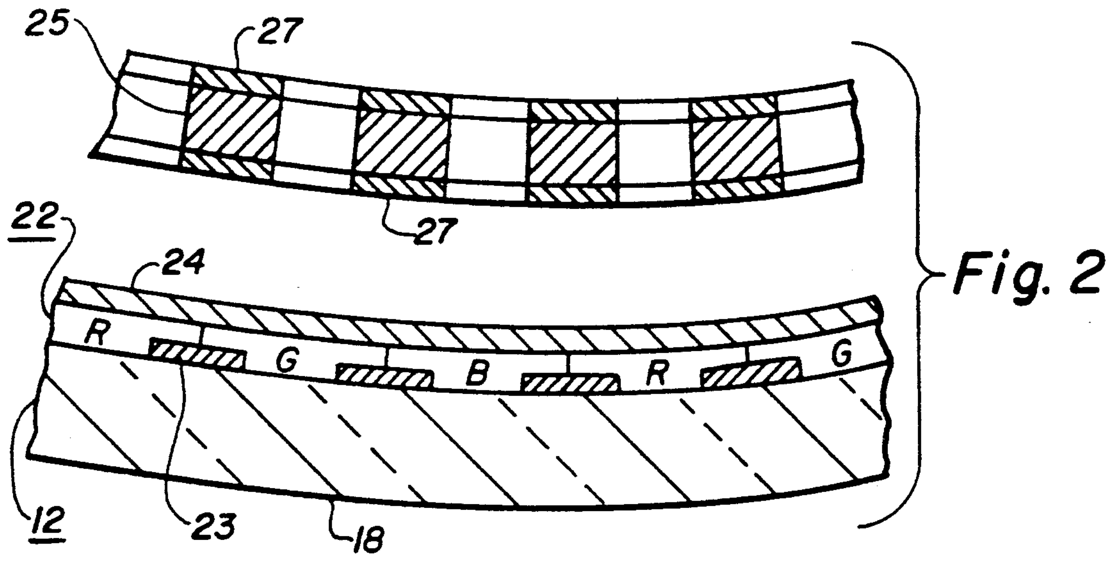
FIG. 2 shows an enlarged portion of the tube faceplate and color selection electrode assembly within circle 2 of FIG. 1.

FIG. 1 shows a color CRT 10 having a glass envelope 11 comprising a rectangular faceplate panel 12 and a tubular neck 14 connected by a rectangular funnel 15. The funnel 15 has an internal conductive coating (not shown) that contacts an anode button 16 and extends into the neck 14. The panel 12 comprises a viewing faceplate or substrate 18 and a peripheral flange or sidewall 20, which is sealed to the funnel 15 by a glass frit 21. A three color phosphor screen 22 is carried on the inner surface of the faceplate 18. The screen 22, shown in FIG. 2, is a line screen which includes a multiplicity of screen elements comprised of red-emitting, green-emitting and blue-emitting phosphor stripes R, G and B, respectively, arranged in color groups or picture elements of three stripes or triads, in a cyclic order. The stripes extend in a direction which is generally normal to the plane in which the electron beams are generated. In the normal viewing position of the embodiment, the phosphor stripes extend in the vertical direction. Preferably, at least a portion of the phosphor stripes overlap a relatively thin, light-absorptive matrix 23, as is known in the art. Alternatively, the screen can be a dot screen. A thin conductive layer 24, preferably of aluminum, overlies the screen 22 and provides a means for applying a uniform potential to the screen, as well as for reflecting light, emitted from the phosphor elements, through the faceplate 18. The screen 22 and the overlying aluminum layer 24 comprise a screen assembly.

A multi-apertured color-selection electrode 25 is secured to a frame 26 to form a color-selection electrode assembly which is removably mounted, by conventional means, in predetermined spaced relation to the screen assembly. The color-selection electrode 25 may be a shadow mask, a tension mask, or other similar structure known in the art. The color selection electrode may be made of steel or a low expansion nickel-iron alloy. A dark, adherent coating 27, shown in FIG. 2, is formed on the exposed metal surfaces of the color-selection electrode assembly by the novel method of the present invention.

An electron gun 28, shown schematically by the dashed lines in FIG. 1, is centrally mounted within the neck 14, to generate and direct three electron beams 29 along convergent paths, through the apertures in the mask 25, to the screen 22. The gun 28 may be, for example, a bi-potential electron gun of the type described in U.S. Pat. No. 4,620,133, issued to Morrell et al., on Oct. 28, 1986, or any other suitable gun.

The tube 10 is designed to be used with an external magnetic deflection yoke, such as yoke 30, located in the region of the funnel-to-neck junction. When activated, the yoke 30 subjects the three beams 29 to magnetic fields which cause the beams to scan horizontally and vertically, in a rectangular raster, over the screen 22. The initial plane of deflection (at zero deflection) is shown by the line P-P in FIG. 1, at about the middle of the yoke 30. For simplicity, the actual curvatures of the deflection beam paths in the deflection zone are not shown.

An example of the novel method for forming a dark, adherent coating on the metal surfaces of a color-selection electrode assembly, for example on a shadow mask-frame assembly, will now be described. The metal surfaces must be clean and free of oil and rust. The surfaces, initially, are cleaned by vapor degreasing in a suitable hydrocarbon solvent, such as FREON. A first solution of aqueous phosphoric acid having a concentration within the range of about 1.0 to 2.0 percent, by weight, 1.5 wt. % being preferred, then is applied to the metal surfaces to remove, and further inhibit, surface rust. Next, the surfaces of the color-selection assembly are contacted, e.g., by dipping, with a second solution consisting essentially of selenium dioxide and methanol. The concentration of selenium dioxide is within the range of about 0.01 to 8.0 percent, by weight, 2.0 wt % being preferred. The degree of darkening of the metal surfaces is controlled by varying the concentration, and/or the time of contact between the metal surfaces and the second solution. Typically, the metal is immersed in the preferred concentration of the second solution for about 15 seconds to uniformly contact the exposed metal surfaces of the mask assembly and to form the dark, adherent coating 27 on the exposed surfaces thereof. A suitable second solution is Birchwood Casey's Perma Blue, available from Birchwood Laboratory, Inc., Eden Prairie, MN. The mask assembly is rinsed in water to remove therefrom any residual second solution that did not react with the mask assembly A sealing solution of aqueous tannic acid having a concentration within the range of about 10.0 to 15.0 percent, by weight, and, preferably about 12.0 wt %, is applied, e.g. by dipping, to the surfaces of the mask assembly. The adherences of the dark coating formed by the novel process is superior to coatings formed by prior processes as evidenced by the resistance of the novel coating to cracking and flaking-off when the coated metal is subjected to a bend test, such as that described in U.S. Pat. No. 4,819,489, issued on Apr. 11, 1989 to Nelson et al., and incorporated by reference herein for the purpose of disclosure.

What is claimed is:

1. A method for making a dark, adherent coating on exposed metal surfaces of a color-selection electrode assembly of a cathode-ray tube, the method comprising the steps of applying a first solution of aqueous phosphoric acid to said exposed metal surfaces of said assembly;

contacting said surfaces with a second solution of selenium dioxide and methanol;

rinsing the surfaces in water to remove any residual second solution therefrom; and then, applying a sealing solution of aqueous tannic acid to said surfaces.

2. The method of claim 1 wherein prior to said step of applying said first solution, the method includes the additional step of vapor degreasing said surfaces.

3. The method of claim 1 wherein said first solution has a concentration of phosphoric acid within the range of about 1.0 to 2.0%, by weight.

4. The method of claim 3 wherein the concentration of phosphoric acid is about 1.5%, by weight.

5. The method of claim 1 wherein the concentration of selenium dioxide in the second solution is within the range of about 0.01 to 8.0%, by weight, of said methanol.

6. The method of claim 5 wherein the concentration of selenium dioxide is about 2.0%, by weight, of said methanol.

7. The method of claim 1 wherein the concentration of tannic acid is within the range of 10.0 to 15.0%, by weight.

8. The method of claim 7 wherein the concentration of tannic acid is about 12.0%, by weight.

9. A method for making a dark, adherent coating on metal surfaces of an element of a cathode-ray tube, the method comprising the steps of applying a first solution of aqueous phosphoric acid to said surfaces;

contacting said surfaces with a second solution of selenium dioxide and methanol;

rinsing said surfaces; and then, applying a sealing solution to said surfaces.

10. The method of claim 9 wherein prior to said step of applying said first solution, the method includes the step of cleaning said surfaces.

11. The method of claim 9 wherein said first solution has a concentration of phosphoric acid within the range of about 1.0% to 2.0%, by weight.

12. The method of claim 11 wherein the concentration of phosphoric acid is about 1.5%, by weight.

13. The method of claim 9 wherein the concentration of selenium dioxide in said second solution is within the range of about 0.01% to 8.0%, by weight, of said methanol.

14. The method of claim 13 wherein the concentration of selenium dioxide is about 2.0%, by weight, of said methanol.

15. The method of claim 9 wherein sad rinsing is done in water.

16. The method of claim 9 wherein said sealing solution comprises tannic acid.

17. The method of claim 16 wherein the concentration of tannic acid is within the range of about 10.0% to 15.0% by weight.

18. The method of claim 17 wherein the concentration of tannic acid is about 12.0%, by weight.

* * * * *